(12) United States Patent
Lee et al.

(10) Patent No.: US 12,738,956 B2
(45) Date of Patent: Sep. 15, 2026

(54) SAB BASED LOOP FILTER WITH CROSS-COUPLED STRUCTURE AND ADC INCLUDING THE SAME

(71) Applicant: SAMSUNG ELECTRONICS CO., LTD., Suwon-si (KR)

(72) Inventors: Jongmi Lee, Suwon-si (KR); Seongeun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 104 days.

(21) Appl. No.: 18/739,534

(22) Filed: Jun. 11, 2024

(65) Prior Publication Data

US 2025/0055474 A1 Feb. 13, 2025

(30) Foreign Application Priority Data

Aug. 11, 2023 (KR) ........................ 10-2023-0105767
Nov. 28, 2023 (KR) ........................ 10-2023-0168470

(51) Int. Cl.
*H03M 3/00* (2006.01)

(52) U.S. Cl.
CPC ............. *H03M 3/458* (2013.01); *H03M 3/39* (2013.01)

(58) Field of Classification Search
CPC ........ H03M 3/40; H03M 3/392; H03M 3/452; H03M 3/34; H03M 3/454; H03M 3/406; H03M 3/422; H03M 3/43; H03M 1/1245; H03M 1/303; H03M 1/462; H03M 3/358; H03M 3/368; H03M 3/38; H03M 3/388; H03M 3/396; H03M 3/398; H03M 3/402; H03M 3/418; H03M 3/424; H03M 3/45;
(Continued)

(56) References Cited

U.S. PATENT DOCUMENTS 6,148,048 A * 11/2000 Kerth .................. H04B 1/0007
375/345
6,225,928 B1 * 5/2001 Green ..................... H03M 3/40
341/143
(Continued)

FOREIGN PATENT DOCUMENTS

EP 2074696 B1 8/2017
EP 4102717 A1 12/2022

OTHER PUBLICATIONS

Shi, et al., "10.4 A 3.7 mW 12.5MHz 81dB-SNDR 4th-Order CTDSM with Single-OTA and 2nd-Order NS-SAR", ISSCC 2021, Session 10, Continuous-Time ADCs AND DACs, 10.4, 3 pages.

*Primary Examiner* — Linh V Nguyen
(74) *Attorney, Agent, or Firm* — Morgan, Lewis & Bockius LLP

(57) ABSTRACT

Disclosed is a loop filter, comprising, a first single-amplifier biquad (SAB) integrator configured to apply an integration operation to an in-phase (I) input signal; a second SAB integrator configured to apply an integration operation to a quadrature (Q) input signal; a first cross-coupled path between an output terminal of the first SAB integrator and an input side of the second SAB integrator and configured to apply a first gain to an output voltage of the first SAB integrator; and a second cross-coupled path between an output terminal of the second SAB integrator and an input side of the first SAB integrator and configured to apply a negative of the first gain to an output voltage of the second SAB integrator.

19 Claims, 12 Drawing Sheets

(58) Field of Classification Search
CPC ...... H03M 3/458; H03M 3/464; H03M 3/506; H03M 7/3013; H03M 7/3026; H03M 7/3033; H03M 7/304
USPC ........................................ 341/143, 121, 155
See application file for complete search history.

(56) References Cited

U.S. PATENT DOCUMENTS

| | | | | |
|---|---|---|---|---|
| 6,480,129 | B1 * | 11/2002 | Melanson | H03M 7/3013 341/200 |
| 7,031,690 | B2 * | 4/2006 | Prodanov | H03H 17/0277 455/307 |
| 7,116,254 | B1 * | 10/2006 | Nagai | H03M 3/34 341/143 |
| 8,830,107 | B1 * | 9/2014 | Karthaus | H03M 3/41 455/249.1 |
| 9,496,890 | B2 | 11/2016 | Cho et al. | |
| 9,559,719 | B1 * | 1/2017 | Kauffman | H03M 3/30 |
| 9,793,917 | B2 | 10/2017 | Dorevitch | |
| 10,879,924 | B2 | 12/2020 | Zhou | |
| 11,476,868 | B2 | 10/2022 | Tangirala | |
| 11,509,327 | B2 | 11/2022 | Birdsong et al. | |
| 2005/0191980 | A1 * | 9/2005 | Oliaei | H03M 3/40 455/313 |
| 2006/0284751 | A1 * | 12/2006 | San | H03M 3/34 341/143 |
| 2010/0019944 | A1 * | 1/2010 | Oliaei | H03M 3/392 341/143 |
| 2011/0254718 | A1 * | 10/2011 | Matsukawa | H03M 3/376 327/344 |
| 2011/0316729 | A1 * | 12/2011 | San | H03M 3/368 341/110 |
| 2013/0083868 | A1 * | 4/2013 | Onody | H03M 3/392 341/143 |

* cited by examiner

Ain

1050

1100

Loop Filter

1300

Quantizer

Dout

1500

DAC

FB 1110a
2nd order feedforward Integrator
Vin
R1
C1
1111
R2
Vo1
C2
1112
Vo2
Vout
1110b
SAB based Integrator
Vin
Rin
C2
R1
-1
C1
1113
Vout

SAB BASED LOOP FILTER WITH CROSS-COUPLED STRUCTURE AND ADC INCLUDING THE SAME

CROSS-REFERENCE TO RELATED APPLICATIONS

This application claims priority under 35 U.S.C. § 119 to Korean Patent Application No. 10-2023-0105767 filed on Aug. 11, 2023, and Korean Patent Application No. 10-2023-0168470 filed on Nov. 28, 2023 in the Korean Intellectual Property Office, the disclosures of which are incorporated by reference herein in their entireties.

TECHNICAL FIELD

Embodiments of the present disclosure described herein relate to a semiconductor device, and more specifically, to a single-amplifier biquad (SAB)-based loop filter and an analog-to-digital converter (ADC) including the same.

DISCUSSION OF RELATED ART

As mobile devices have proliferated in recent years, a demand has developed for an ADC for Bluetooth and other protocol-capable devices having a wider bandwidth, e.g., twice as wide as legacy designs. An ADC may include a SAB filter, which is used as a low pass or band pass filter to filter out high frequency noise prior to the analog to digital conversion. A SAB filter may be understood as a type of linear filter, employing a single amplifier, that receives an in-phase (I) input and a quadrature phase (Q) input and exhibits a transfer function with respect to the I and Q inputs. A structure that has high power efficiency and that can increase the gain, within a target band, of an integrator of the ADC, would be desirable for an ADC employing a SAB filter.

To double the bandwidth, a method of increasing the sampling frequency is generally used. However, this increases the overall power consumption of the ADC.

Therefore, there is a need for a new SAB-structured loop filter to increase resolution without increasing (or minimizing any increase in) the sampling frequency.

SUMMARY

Embodiments of the present disclosure provide a low-power and high-resolution single-amplifier biquad (SAB) structure-based loop filter and delta-sigma modulation analog-to-digital converter DSM-ADC without increasing the sampling frequency.

According to an embodiment of the present disclosure, a loop filter includes: a first single-amplifier biquad (SAB) integrator configured to apply an integration operation to an in-phase (I) input signal; a second SAB integrator configured to apply an integration operation to a quadrature (Q) input signal; a first cross-coupled path between an output terminal of the first SAB integrator and an input side of the second SAB integrator and configured to apply a first gain to an output voltage of the first SAB integrator; and a second cross-coupled path between an output terminal of the second SAB integrator and an input side of the first SAB integrator and configured to apply a negative of the first gain to an output voltage of the second SAB integrator. At least one of the first SAB integrator or the second SAB integrator includes a self-feedback path of a second gain for providing at least one pole to the transfer function of the loop filter.

According to an embodiment of the present disclosure, a delta-sigma modulation ADC includes: a loop filter configured to integrate a difference signal between an input signal and a feedback signal, a quantizer configured to quantize an output of the loop filter to output a digital signal, and a digital-to-analog converter (DAC) configured to convert the digital signal into an analog signal and provides the analog signal as the feedback signal. The difference signal includes an I input signal and a Q input signal, and the loop filter performs SAB multi-order integration on each of the I and Q input signals and feeds back each integration result using a respective cross-coupled path.

According to an embodiment of the present disclosure, a loop filter includes: a first integrator configured to apply an integration operation to the in-phase input signal, a second integrator configured to apply the integration operation to the quadrature input signal, and a cross-coupled path configured to cross-transfer an output voltage of the first integrator to an input side of the second integrator, and an output voltage of the second integrator to an input side of the second integrator. At least one of the first integrator or the second integrator performs the integration operation using a SAB integrator configuration.

BRIEF DESCRIPTION OF THE FIGURES

The above and other aspects and features of the present disclosure will become apparent by describing in detail embodiments thereof with reference to the accompanying drawings.

FIG. 1 is a block diagram illustrating a delta-sigma modulation analog-to-digital converter DSM-ADC according to an embodiment of the present disclosure.

DETAILED DESCRIPTION

Figure 2:
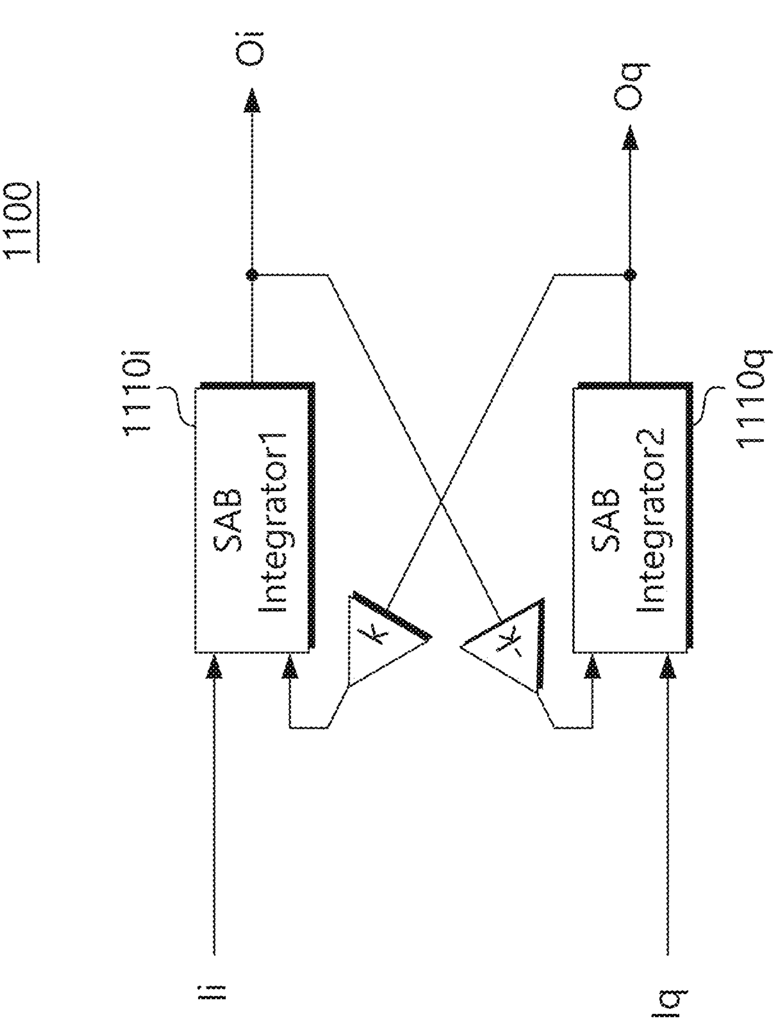
FIG. 2 is a block diagram exemplarily showing the configuration of the loop filter of FIG. 1.

It is to be understood that the following detailed description describes exemplary embodiments, and components known to those skilled in the art may not be described in detail to avoid obscuring the inventive subject matter. The same or similar reference characters may be used in the description and drawings to refer to the same or similar parts.

Figure 1:
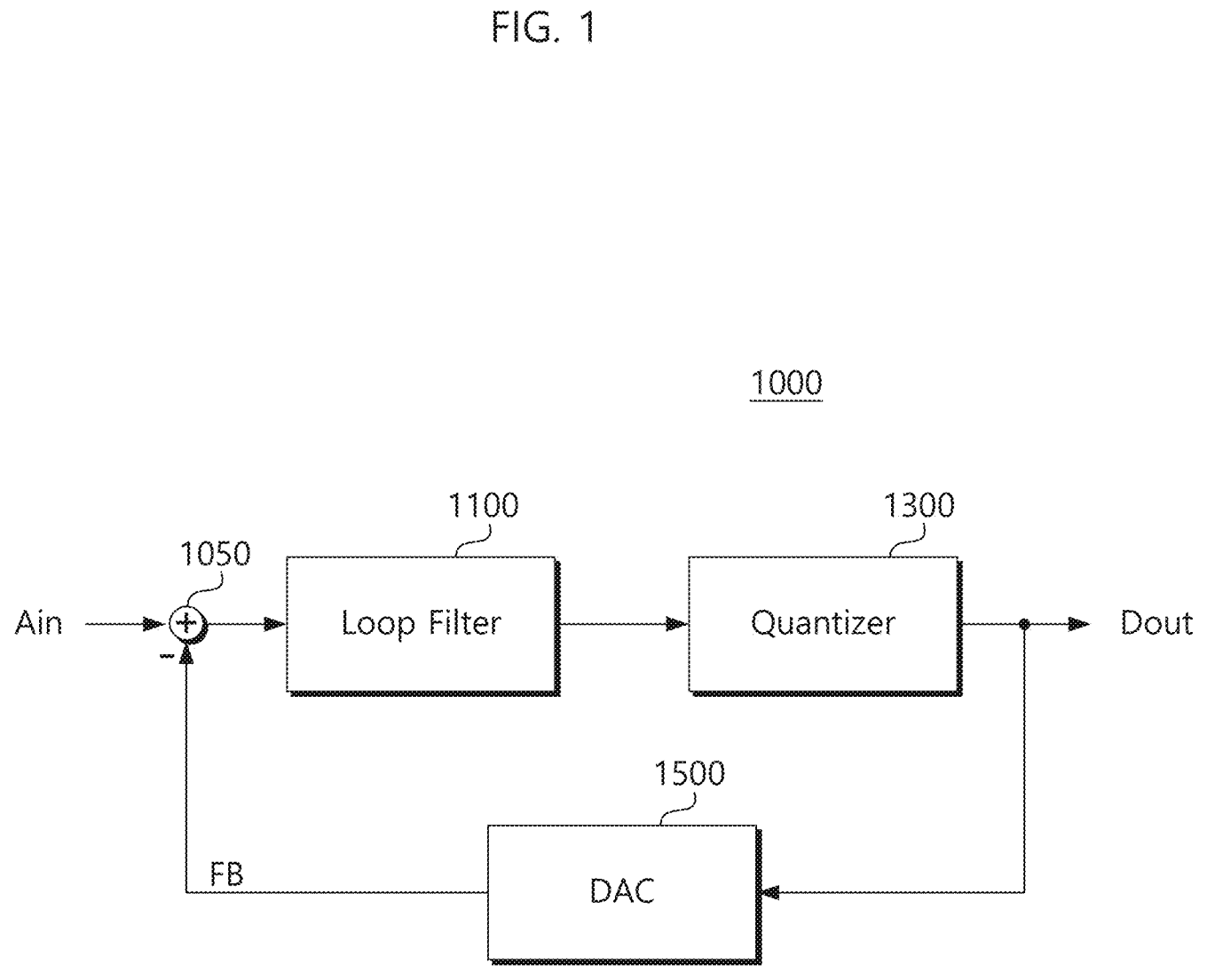

FIG. 1 is a block diagram illustrating a delta-sigma modulation analog-to-digital converter (ADC), 1000, according to an embodiment of the present disclosure. The delta-sigma modulation ADC 1000 may include an adder 1050, a loop filter 1100, a quantizer 1300, and a digital-to-analog converter 1500.

The loop filter 1100 integrates the difference between the analog input signal Ain and the feedback signal FB output from the digital-to-analog converter 1500. Although not shown in FIG. 1, the analog signal Ain may be composed of two signals: an in-phase (I) signal and a quadrature phase (Q) signal. Subtraction of the feedback signal FB from the analog input signal Ain may be performed through the adder 1050. (A respective feedback signal FB may be subtracted from each of the I signal and the Q signal of the input signal Ain.) The loop filter 1100 performs an integration operation on the difference signal (Ain-FB) using at least one integrator. In particular, the loop filter 1100 of the present inventive concept can apply a single-amplifier biquad (SAB) structure capable of multi-order integration using one integrator. Additionally, the loop filter 1100 can improve the gain of the integrator in a specific band by applying a cross-coupled path to each of the in-phase and quadrature components, which will be explained below.

The quantizer 1300 quantizes the signal output from the loop filter 1100 and converts it into a digital signal Dout. That is, the quantizer 1300 may receive the output of the loop filter 1100, compare it with a reference signal, and output the digital signal Dout quantized into discrete levels. For example, the quantizer 1300 may include a comparator that receives the output of the loop filter 1100 and compares it with a reference signal. By way of example, the quantizer 1300 may be a 1-bit, 2-bit, or multi-bit quantizer. The digital signal Dout may include quantization noise.

The DAC 1500 converts the digital signal Dout output from the quantizer 1300 into analog form and provides the converted analog signal as the feedback signal FB. This conversion to an analog signal may be in response to a clock signal (not shown). Then, the DAC 1500 transfers the converted feedback signal FB to the adder 1050. The delta-sigma modulation ADC 1000 of this structure may have a negative feedback structure in which the feedback signal FB is subtracted from the analog input signal Ain through the adder 1050.

As mentioned, the ADC 1000 may include a loop filter 1100 using the SAB based integrator. Additionally, the loop filter 1100 may have a pole of the transfer function that can increase the gain of the integrator in a target frequency band. Because the loop filter 1100 may have the cross-coupled path between in-phase and quadrature components, the ADC 1000 can implement low-power and high-resolution performance even in an intermediate frequency (IF) band.

FIG. 2 is a block diagram showing an exemplary configuration of the loop filter of FIG. 1. Referring to FIG. 2, the loop filter 1100 may include a first SAB integrator 1110_*i* in an in-phase path and a second SAB integrator 1110_*q* in a quadrature-phase path. Additionally, the loop filter 1100 may be configured in a cross-coupled structure in which the output of each of the SAB integrators 1110_*i* and 1110_*q* is fed back to the input side of the other integrator.

The input signals (Ii, Iq) may be provided as an in-phase (I) input signal Ii and a quadrature (Q) input signal Iq, respectively. The SAB integrators 1110_*i* and 1110_*q* will respectively generate an in-phase output signal Oi at a first output terminal of the loop filter 1100, and a quadrature output signal Oq at a second output terminal of the loop filter 1100, after performing filtering using the input signals (Ii, Iq) and the fed-back signals.

The first SAB integrator 1110_*i* generates the in-phase output signal Oi by filtering the in-phase input signal Ii and the quadrature output signal Oq fed back in the in-phase path. The first SAB integrator 1110_*i* has a SAB structure for configuring a second order or higher order integrator using one amplifier. The first SAB integrator 1110_*i* may function as a second- or higher-order integrator (i.e., a multi-order integrator) using one amplifier and a plurality of passive elements. (Herein, the term "multi-order integrator" encompasses both a second order and a higher order integrator.) By implementing a multi-order integrator, the first SAB integrator 1110_*i* can remove low frequency components and suppress noise of the loop filter 1100 in a specific band.

The second SAB integrator 1110_*q* generates a quadrature output signal Oq by filtering the quadrature input signal Iq and the in-phase output signal Oi fed back in the quadrature path. The second SAB integrator 1110_*q* is also formed in the SAB structure to configure a multi-order integrator using one amplifier. The second SAB integrator 1110_*q* can also remove low-frequency noise by increasing the slope of the transfer function through implementation of a multi-order integrator using one amplifier. The second SAB integrator 1110 may be implemented using substantially the same configuration as the first SAB integrator 1110_*i*.

In addition to adding an appropriate pole to the transfer function by implementing SAB integrators 1110_*i* and 1110_*q* as multi-order integrators, cross-coupling technology is applied to increase the resolution of the delta-sigma modulator 1000 (refer to FIG. 1). In other words, the output of the first SAB integrator 1110_*i* located in the in-phase path can be fed back to the input side of the second SAB integrator 1110_*q* located in the quadrature path. Additionally, the output of the second SAB integrator 1110_*q* located in the quadrature path can be fed back to the input side of the first SAB integrator 1110_*i* located in the in-phase path.

Through the application of this cross-coupling technology, flicker noise of low frequency components can be effectively avoided, as the operating band of the loop filter 1100 is shifted to a target frequency band. Herein, cross-coupling technology refers to a technology that processes signals from in-phase and quadrature paths by mixing them. In the present embodiment, the output Oi and Oq of each of the SAB integrators 1110_*i* and 1110_*q* can be multiplied by the cross gain (k, −k) and fed back to the input side of the SAB integrators 1110_*i* and 1110_*q* of the opposite phase. The characteristics of this cross-coupling technology will be explained in detail through mathematical equations described later.

Figure 3:
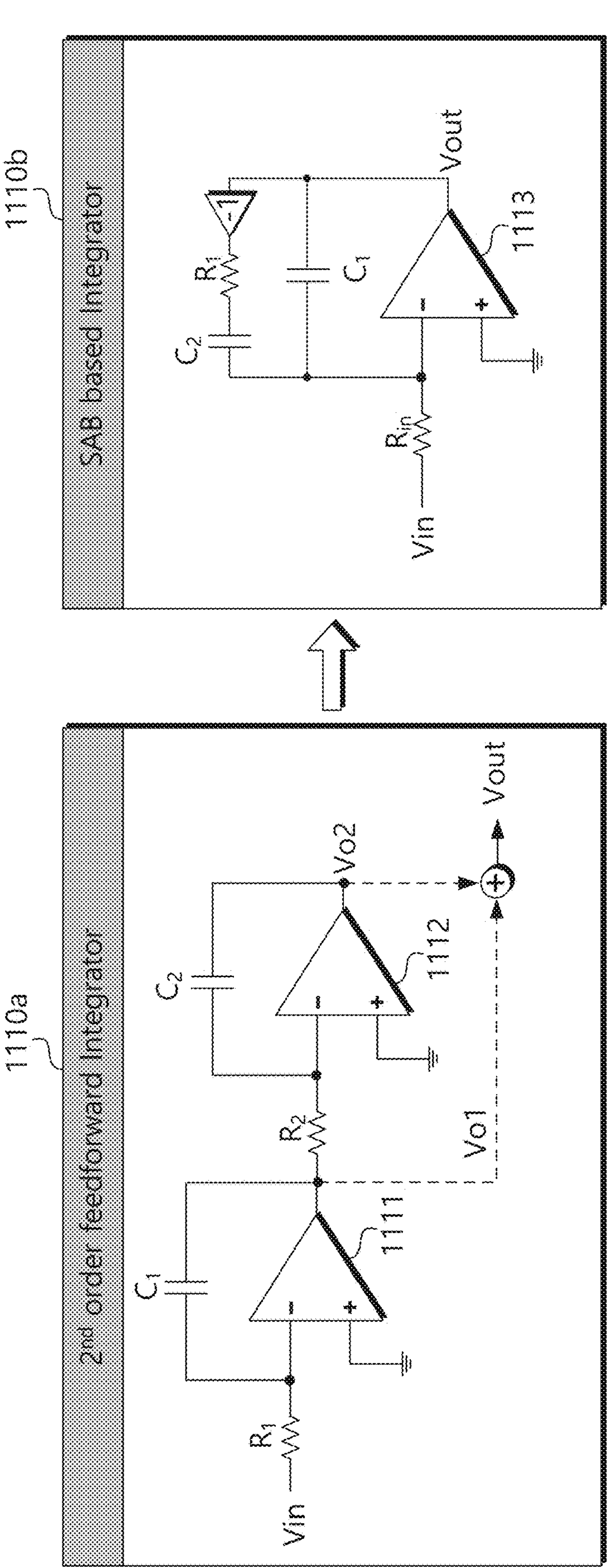
FIG. 3 is a circuit diagram exemplarily showing a method of configuring a SAB integrator.

FIG. 3 is a circuit diagram exemplarily showing a method of configuring a SAB integrator. Referring to FIG. 3, a general integrator 1110*a* and a SAB integrator 1110*b* for implementing a $2^{nd}$ order feedforward integrator are shown.

There are various ways to configure an integrator. The most common type of integrator is one that uses an integration amplifier (e.g., an operational amplifier (OP-AMP)), a resistor R, and a capacitor C. In the most common integrator form, the amplifier's input is maintained at virtual ground. Therefore, a current equal to the voltage between the input of the amplifier and virtual ground divided by the resistance R is transferred to the capacitor C. The current or charge delivered to the capacitor C is charged to the capacitor C.

The characteristics of the capacitor C, in which the voltage at both ends changes depending on the amount of charge being charged, makes it possible to function as an integrator. To implement a multi-order integrator, a method of connecting these integrators in a cascade form is used.

According to a general integrator 1110*a* for configuring a second-order integrator, a primary integrator comprising a first resistor $R_1$ for the input voltage Vin, a first amplifier 1111, and a first capacitor $C_1$, and a secondary integrator comprising a second resistor $R_2$, a second amplifier 1112 and a second capacitor $C_2$ may be used. The output voltage Vout appears as the sum of the output of the first integrator Vo1 and the output of the second integrator Vo2. In this way, the characteristics of a noise transfer function NTF can be improved by increasing the order of the integrator. However, in the general integrator 1110*a*, the number of integrators are increased to increase the integration order. Therefore, an increase in overall power consumption inevitably follows.

The need to increase the number of amplifiers as the order of the integrator increases can be solved by substituting a single-amplifier biquad (SAB) structure. According to the SAB integrator 1110*b* applying the SAB structure, it is possible to obtain input/output characteristics equivalent to using two integrators with only one amplifier 1113. In other words, a second order or higher order integrator can be implemented using one amplifier 1113. In the SAB integrator 1110*b*, to obtain an output similar to the second order integrator, '−1' gain (e.g., employing an inverting circuit ("inverter") represented by the '−1' operator) for the output Vout is fed back to the input side via the first resistor $R_1$ and the second capacitor $C_2$. However, since only one amplifier 1113, which significantly contributes to power consumption, is used, overall power consumption can be reduced in a multi-order integrator using the SAB integrator 1110*b*.

Figure 4:
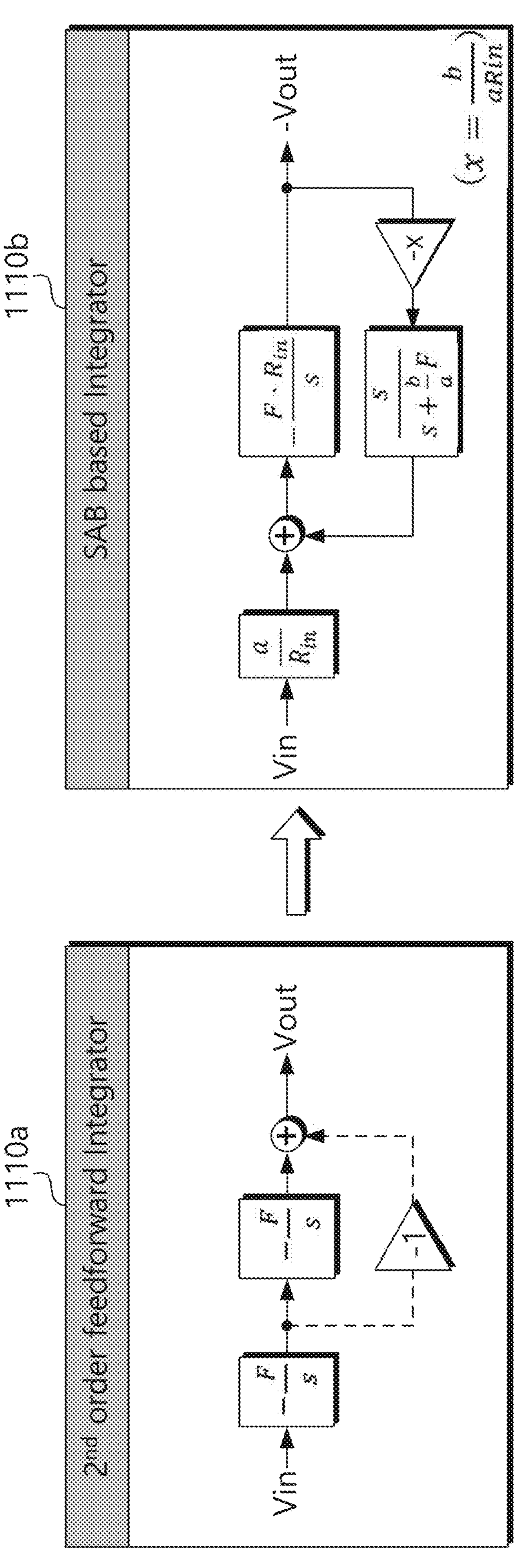
FIG. 4 is a block diagram expressing the characteristics of the circuit diagrams of FIG. 3 using the Laplace transform method.

FIG. 4 is a block diagram expressing the characteristics of the circuit diagrams of FIG. 3 using the Laplace transform method. Referring to FIG. 4, the general integrator 1110*a* and the SAB integrator 1110*b* each appear as integrators having a second order.

In the general integrator 1110*a*, the transfer function of the output voltage Vout with respect to the input voltage Vin is expressed as Equation 1 below.

$$\frac{Vout}{Vin} = \left(\frac{1}{sC_1R_1} + \frac{1}{s^2C_1C_2R_1R_2}\right) = \frac{F}{s} + \frac{F^2}{s^2} \quad \text{[Equation 1]}$$

Here, 'F' can be considered a parameter related to the sampling frequency (1/RC) of the integrator. The output voltage Vout in the SAB integrator 1110*b* can be expressed as Equation 2 below.

$$\left(\frac{aVin}{R_{in}} + \frac{s \cdot x \cdot Vout}{s + \frac{b}{a}F}\right)\left(-\frac{FR_{in}}{s}\right) = -Vout\left(\text{if, } x = \frac{b}{aR_{in}}\right) \quad \text{[Equation 2]}$$

To summarize Equation 2, the transfer function of the output voltage Vout to the input voltage Vin in the SAB integrator 1110*b* is expressed as Equation 3 below.

$$\frac{Vout}{Vin} = \frac{aF\left(s + \frac{b}{a}F\right)}{s^2} = \frac{aF}{s} = \frac{bF^2}{s^2} \quad \text{[Equation 3]}$$

Finally, the transfer function of the SAB integrator 1110*b* is expressed as Equation 3, and the weight value required in the transfer function can be generated by adjusting 'a' and 'b', where 'a' and 'b' are constants. Ultimately, both Equation 1 and Equation 3 appear to include the second order integral.

The SAB integrator 1110*b* according to Equation 3 can be implemented as a second order integrator even when using a single amplifier 1113. Therefore, a multi-order integrator can be implemented without increasing the number of amplifiers, providing a way to increase power performance. However, because only one amplifier is used, it is difficult to provide a pole of the transfer function that can significantly reduce noise in a specific band.

Figure 5:
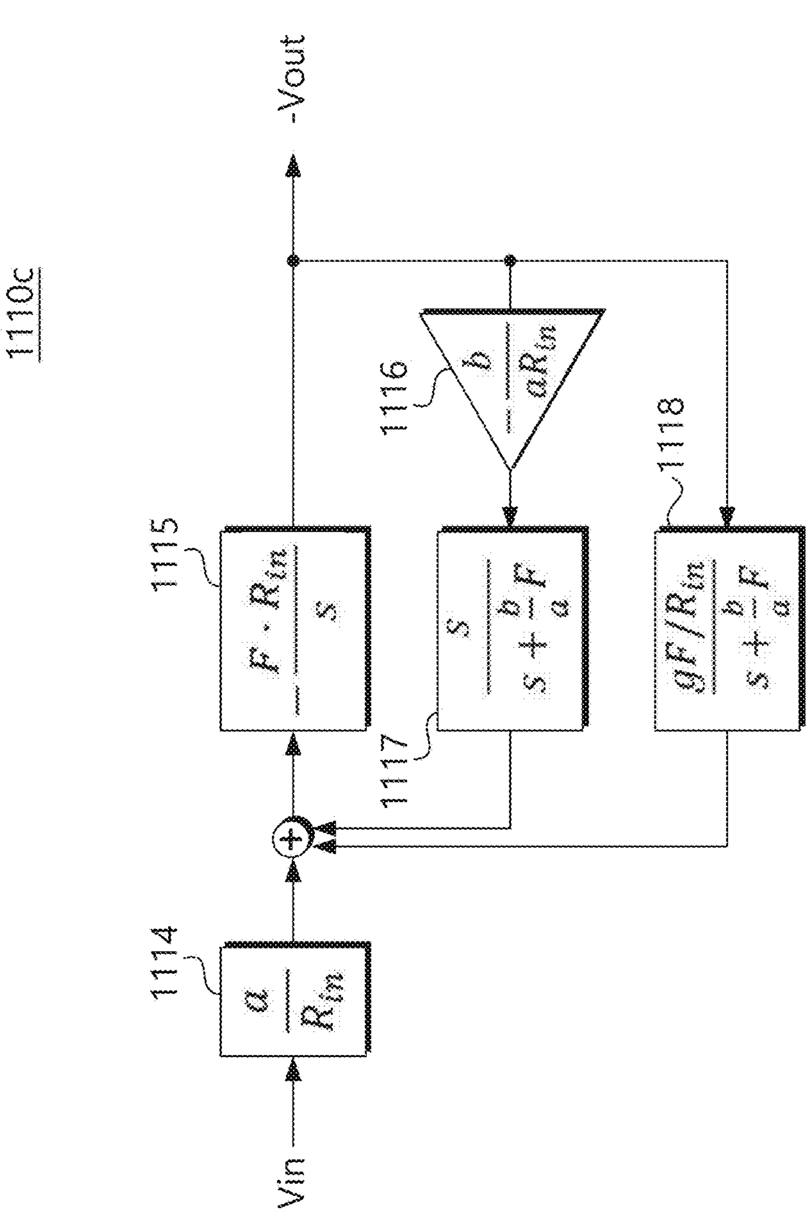
FIG. 5 is a block diagram showing a structure for adding a zero path of a noise transfer function NTF in the SAB integrator of FIG. 4.

FIG. 5 is a block diagram showing a structure for adding a zero path of the noise transfer function NTF in the SAB integrator of FIG. 4. Referring to FIG. 5, the SAB integrator 1110*c* further includes a feedback component 1118 to provide a zero path to a noise transfer function NTF compared to the SAB integrator 1110*b* of FIG. 4.

To add a zero path ("add a zero") to the noise transfer function NTF of the SAB integrator 1110*b*, it can be implemented by forming a pole in the transfer function of the SAB integrator 1110*b*. Here, components 1114, 1115, and 1116 each represent path components of the SAB integrator 1110*b* in FIG. 4. The transfer function of the SAB integrator 1110*c*, which includes the feedback component 1118, can be expressed as Equation 4 below.

$$\frac{Vout}{Vin} = \frac{asF + bF^2}{s^2 + gF^2} \quad \text{[Equation 4]}$$

According to the transfer function of the SAB integrator 1110*c* expressed in Equation 4, the pole for making the denominator ($s^2$+f$F^2$) '0' is $\pm\sqrt{gF}$ Therefore, it can be seen that a zero can be added to the noise transfer function NTF in the target band even through the SAB-based integrator.

Figure 6:
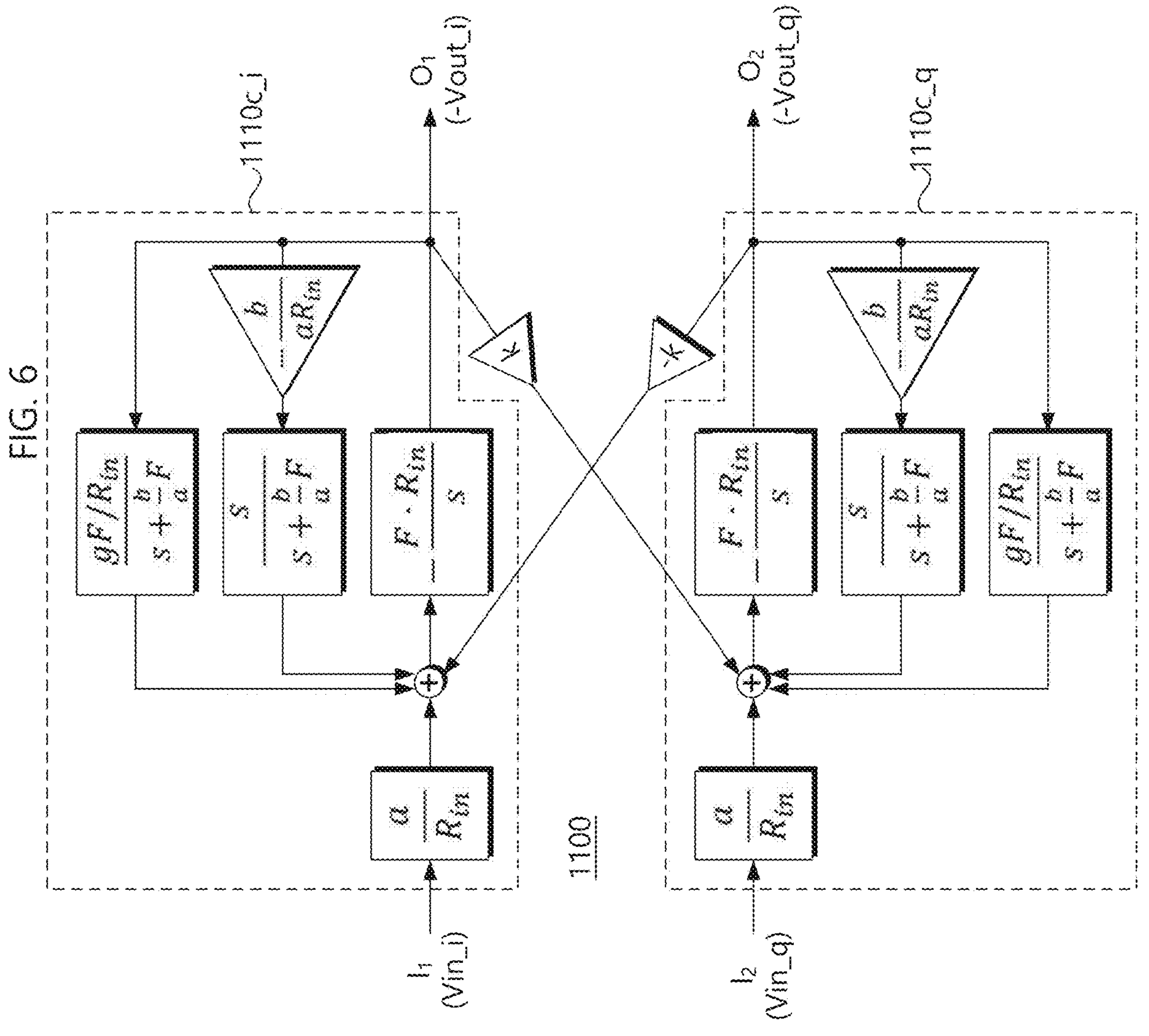
FIG. 6 is a block diagram of adding a cross-couple path to the in-phase and quadrature paths including the SAB integrator of FIG. 5.

FIG. 6 is a block diagram illustrating adding a cross-coupled path to the in-phase and quadrature paths of the SAB integrator of FIG. 5. As shown in FIG. 6, SAB integrators 1110*c_i* and 1110*c_q* are arranged in each of the in-phase and quadrature paths. And the cross-coupled paths of gains 'k' and '-k' can be modeled as being crossed and fed back from the outputs $O_1$ and $O_2$ of the SAB integrators 1110*c_i* and 1110*c_q* to the input side (i.e., adders).

To implement a circuit that adds a cross-coupled path to the in-phase and quadrature paths based on the SAB integrator, the gain k provided by the cross-coupled path is calculated. In embodiments, the gain k of an appropriate cross-coupled path can be obtained by calculating the transfer function in the block diagram and considering the obtained transfer function to be the same as the target equation. For this, the target transfer function T(s) of the SAB integrator with a cross-coupled structure can be expressed as Equation 5 below.

$$T(s) = \frac{sF + F^2}{(s - jw)^2 + gF^2} = \frac{sF}{(s - jw)^2 + gF^2} + \frac{F^2}{(s - jw)^2 + gF^2} \quad \text{[Equation 5]}$$

The target transfer function T(s) expressed in Equation 5 can be separated into a first-order integral term and a second-order integral term, respectively. The second integral term '$F^2/\{(s-jw)^2+gF^2\}$' corresponds to frequency shifting of a pole. On the other hand, the first-order integral term '$sF/\{(s-jw)^2+gF^2\}$' cannot be regarded as perfect frequency shifting of the pole because the 's' term still exists in the numerator. However, since the second-order integral term is dominant within the target band, the first-order integral term is ignored for simplicity of implementation. Then, the outputs $O_1$ and $O_2$ of the integrator in which a cross-coupled path is added to the in-phase and quadrature paths can be expressed as Equation 6 and Equation 7 below.

$$-\frac{FR_{in}}{s}\left(\frac{aI_1}{R_{in}}+O_1\frac{-\frac{b}{aR_{in}}s+\frac{gF}{R_{in}}}{s+\frac{b}{a}F}-kO_2\right)=O_1 \quad \text{[Equation 6]}$$

$$-\frac{FR_{in}}{s}\left(\frac{aI_2}{R_{in}}+O_2\frac{-\frac{b}{aR_{in}}s+\frac{gF}{R_{in}}}{s+\frac{b}{a}F}-kO_1\right)=O_2 \quad \text{[Equation 7]}$$

If the outputs $O_1$ and $O_2$ expressed in Equation 6 and Equation 7 above are expressed in in-phase and quadrature, they can be expressed in complex number form. If Equation 6 and Equation 7 are organized into the complex number expression '$O_1+jO_2$' of the outputs $O_1$ and $O_2$, it can be expressed as Equation 8 below.

$$-\frac{FR_{in}}{s}\left(a\frac{I_1+jI_2}{R_{in}}+(O_1+jO_2)\frac{-\frac{b}{aR_{in}}s+\frac{gF}{R_{in}}}{s+\frac{b}{a}F}+jk(O_1+jO_2)\right)=O_1+jO_2 \quad \text{[Equation 8]}$$

In Equation 8, if the complex number expressions '$O_1+jO_2$' and '$I_1+jI_2$' are replaced with 'O' and 'I', respectively, it results in Equation 9 below.

$$-\frac{FR_{in}}{s}\left(a\frac{I}{R_{in}}+O\frac{-\frac{b}{aR_{in}}s+\frac{gF}{R_{in}}}{s+\frac{b}{a}F}+jkO\right)=O \quad \text{[Equation 9]}$$

If Equation 9 is organized in the form of a transfer function representing the ratio of output 'O' to input 'I', it is expressed as Equation 10.

$$\frac{O}{I}=\frac{-aF\left(s+\frac{b}{a}F\right)}{s^2+\frac{b}{a}Fs-\frac{b}{a}Fs+gF^2+jkFR_{in}\left(s+\frac{b}{a}F\right)} \quad \text{[Equation 10]}$$

Considering that the transfer function in Equation 10 is the same as the theoretical target transfer function T(s) in Equation 5, it can be summarized as Equation 11 below.

$$\frac{sF+F^2}{(s-jw)^2+gF^2}=\frac{-aF\left(s+\frac{b}{a}F\right)}{s^2+gF^2+jkFR_{in}\left(s+\frac{b}{a}F\right)} \quad \text{[Equation 11]}$$

To satisfy Equation 11, the following assumption of Equation 12 can be made.

$$jkFR_{in}\left(s+\frac{b}{a}F\right)=-2jws-w^2 \quad \text{[Equation 12]}$$

If the assumption about Equation 12 is established, 'k' can be finally expressed as Equation 13.

$$k=\frac{-2jws-w^2}{jFR_{in}\left(s+\frac{b}{a}F\right)}=\frac{-2ws}{FR_{in}\left(s+\frac{b}{a}F\right)}+j\frac{w^2}{FR_{in}\left(s+\frac{b}{a}F\right)}=k_1+jk_2 \quad \text{[Equation 13]}$$

Referring to Equation 13 expressing the gain k fed back from the cross-coupled path, to achieve the gain k, at least two paths each in in-phase and quadrature can be provided.

Figure 7:
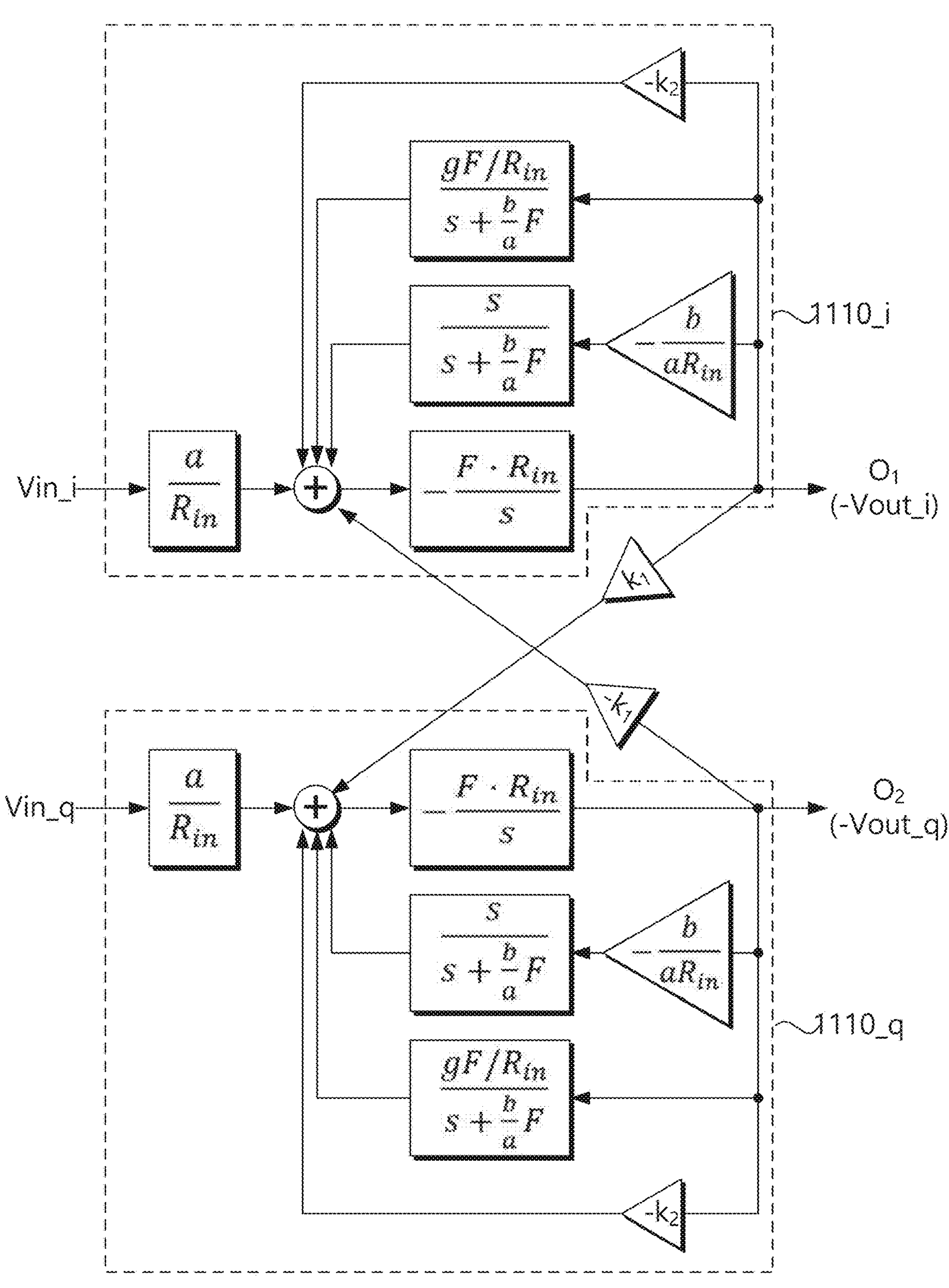
FIG. 7 is a block diagram reconstructed of FIG. 6 considering Equation 13.

FIG. 7 is a block diagram of FIG. 6 reconstructed considering Equation 13. Referring to FIG. 7, to provide a cross-coupled path, a gain '$-k_2$' path is added to each of the in-phase (I) and quadrature (Q) paths.

Considering the gain 'k' expressed in Equation 13, the output component '$-kO_2$' of the quadrature cross-transmitted to the input of the in-phase side is expressed as Equation 14 below.

$$-kO_2=-(k_1+jk_2)O_2=-k_1*O_2-k_2*jO_2=-k_1*O_2-k_2*O_1=\frac{2ws}{FR_{in}\left(s+\frac{b}{a}F\right)}*O_2-\frac{w^2}{FR_{in}\left(s+\frac{b}{a}F\right)}*O_1 \quad \text{[Equation 14]}$$

In Equation 14, considering that '$O_2$' is in an orthogonal relationship with 'Or', '$jO_2$' can be assumed to be the same as 'Or'. Then, it can be seen that the output quadrature component '$kO_2$', which is cross-transmitted to the input of the in-phase side, can be expressed as gains $k_1$ and $k_2$ separated from the outputs $O_2$ and $O_1$. Likewise, the in-phase output component '$kO_1$', which is cross-transmitted to the input of the quadrature side, is expressed in Equation 15 below.

$$kO_1=(k_1+jk_2)O_1=k_1*O_1+k_2*jO_1=k_1*O_1-k_2*O_2=-\frac{2ws}{FR_{in}\left(s+\frac{b}{a}F\right)}*O_1-\frac{w^2}{FR_{in}\left(s+\frac{b}{a}F\right)}*O_2 \quad \text{[Equation 15]}$$

It can be seen that to use a SAB integrator and provide a cross-coupled path, not only the cross-path gain '$k_1$' but also an additional self-path gain '$k_2$' is required for each of the I and Q paths. In other words, to configure the cross-coupled path, the cross-path gain $k_1$ fed back from the output $O_1$ and $O_2$ of the respective I and Q paths to the input side of the other (Q or I) path, and the self-path gain $-k_2$ fed back from itself is interpreted separately.

The first SAB integrator 1110_*i* provides a quadrature output '$O_2$' to which a cross-path gain '$-k_1$' is applied for cross-coupling to the adder. Further, the in-phase output '$O_1$' is fed back to the adder with the self-path gain $k_2$ applied. In the second SAB integrator 1110_*q*, the in-phase output $O_1$ to which the cross-path gain $-k_1$ is applied for cross-coupling is fed back to the adder. Additionally, the quadrature output $O_1$ is fed back to the adder with self-path gain $k_2$.

Figure 8:
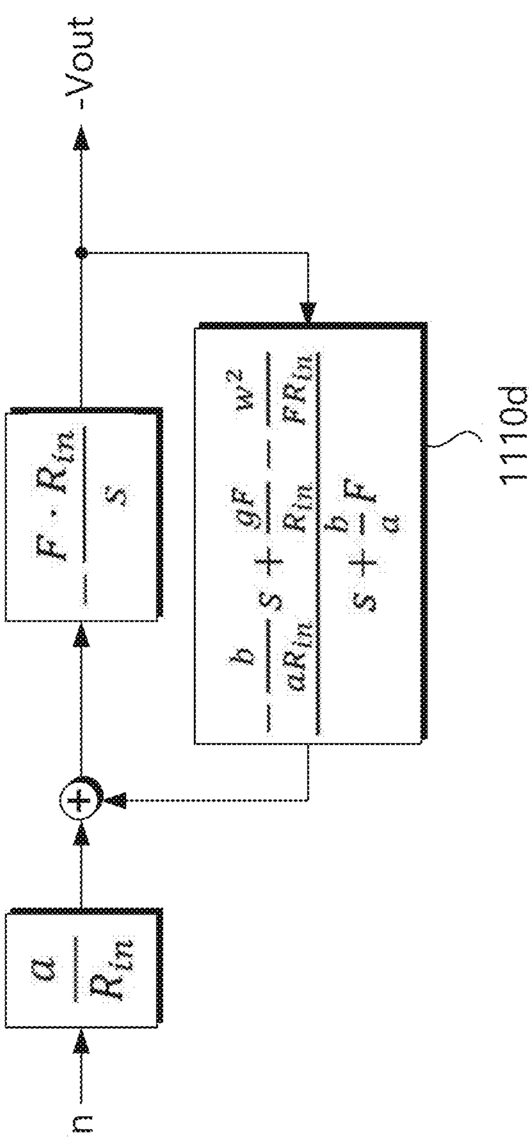
FIG. 8 is a block diagram briefly showing a transfer function of the first SAB integrator or the second SAB integrator excluding the cross-path gain.

FIG. 8 is a block diagram illustrating the transfer function of the first SAB integrator or the second SAB integrator excluding the cross-path gain $k_1$. If the self-path gain $k_2$ defined in Equation 13 is applied to the first SAB integrator 1110_*i* excluding the cross-path gain $k_1$, the first SAB integrator 1110_*i* may be simplified as shown.

When considering the characteristics of only the components excluding the cross-path gain $k_1$, the component 1110*d* of the first SAB integrator 1110_*i* is transmitted to the adder. Note that the characteristics applied from the output of the first SAB integrator 1110_*i* to the input side can be expressed as a combination of passive elements such as resistors or capacitors. To this end, the feedback component of the first SAB integrator 1110_*i* excluding the cross-path gain $k_1$ can be expressed as Equation 16 below.

$$\frac{-\frac{b}{aR_{in}}s+\frac{gF}{R_{in}}-\frac{w^2}{FR_{in}}}{s+F}\cdot\frac{-FR_{in}}{s}=\frac{\left(\frac{\frac{b}{a}F}{w^2-gF^2}s+1\right)}{s+F}\cdot\left(w^2-gF^2\right)\cdot\frac{1}{s}\qquad\text{[Equation 16]}$$

When the block diagram of FIG. 8 is implemented as a circuit diagram by applying Equation 16 described above, it can be represented as FIG. 9, described as follows.

Figure 9:
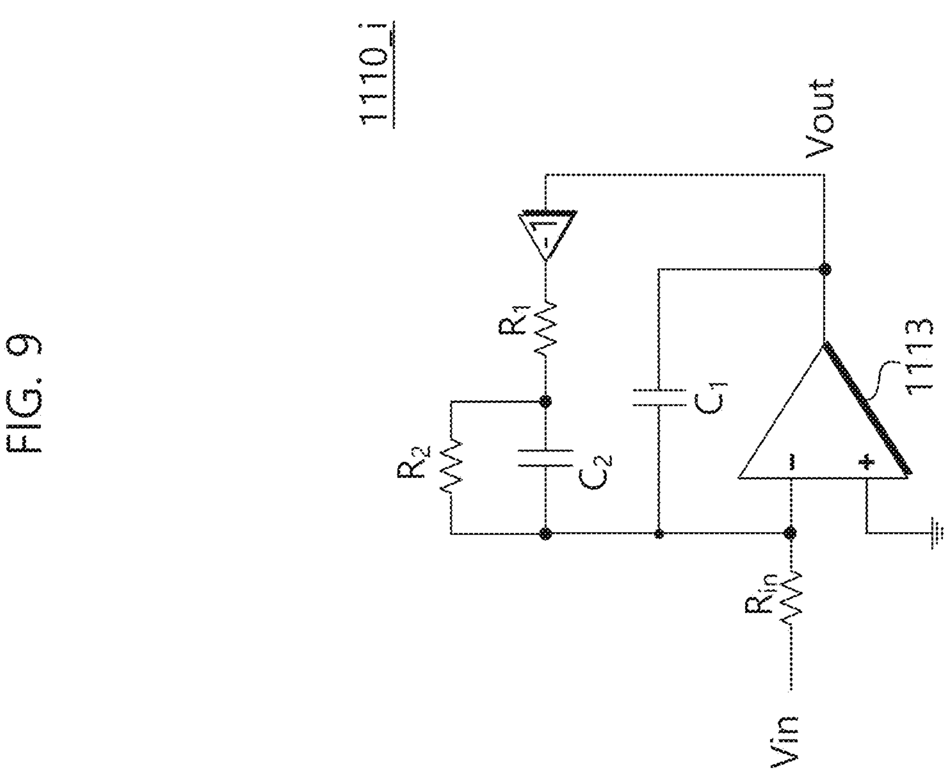
FIG. 9 shows a circuit diagram of the first SAB integrator excluding the cross-path gain of FIG. 8 using a resistor, capacitor, and amplifier.

FIG. 9 shows an example circuit diagram of the first SAB integrator of FIG. 8 (which excludes the cross-path gain $k_1$), using resistors, capacitors, and an amplifier. As shown in FIG. 9, the first SAB integrator 1110_*i* excluding the cross-path gain $k_1$ includes an input resistor $R_{in}$, an amplifier 1113 (e.g., an OP-AMP), first and second capacitors $C_1$ and $C_2$, and first and second resistors $R_1$ and $R_2$.

To configure the first SAB integrator 1110_*i*, the input voltage Vin provided through the input resistor $R_{in}$ is connected to the negative input terminal (−) of the amplifier 1113. The positive input terminal (+) of the amplifier 1113 may be grounded. The first capacitor $C_1$ is connected between the negative input terminal (−) and the output terminal of the amplifier 1113. The '−1' gain for the output Vout (e.g., provided by an inverter (triangular element labeled '−1')) is fed back to the input side via the first resistor $R_1$, the second resistor $R_2$, and the second capacitor $C_2$. Here, the second resistor $R_2$ and the second capacitor $C_2$ are connected in parallel.

The transfer function of the first SAB integrator 1110_*i*, excluding the effect of the cross-path gain $k_1$, can be expressed as Equation 17 below.

$$T(s)=\left(\frac{-1}{R_1+\frac{R_2}{1+sC_2R_2}}\right)\cdot\frac{-1}{sC_1}=\frac{1+sC_2R_2}{R_1+R_2+sC_2R_2R_1}\cdot\frac{1}{sC_1}\qquad\text{[Equation 17]}$$

-continued $$=\frac{1+sC_2R_2}{C_1(R_1+R_2)+sC_2C_1R_2R_1}\cdot\frac{1}{s}$$

Under the assumption that Equations 16 and 17 are identical, it is possible to calculate the values of the first resistor $R_1$, the second resistor $R_2$, the first capacitor $C_1$, and the second capacitor $C_2$. The process of calculating the values of these circuit elements can be expressed as Equation 18 to Equation 21 below.

$$\frac{1}{w^2-gF^2}=C_2C_1R_2R_1\qquad\text{[Equation 18]}$$

$$F=\frac{R_2R_1}{R_1+R_2}\cdot C_2\qquad\text{[Equation 19]}$$

$$\frac{F}{w^2-gF^2}=C_1(R_1+R_2)\qquad\text{[Equation 20]}$$

$$\frac{\frac{b}{a}F}{w^2-gF^2}=C_2R_2\qquad\text{[Equation 21]}$$

Here, 'a' and 'b' are constants, 'F' is the sampling frequency, and 'w' is a parameter related to the shifting frequency. When calculated by combining the above-mentioned Equation 18 and Equation 21, the following expression of Equation 22 below is obtained.

$$\frac{b}{a}F=\frac{1}{C_1R_1}\qquad\text{[Equation 22]}$$

Based on Equation 22, a value of the resistance $R_1$ can first be selected, and then a value of the capacitor $C_1$ can be determined, or vice versa. Next, based on Equation 20, the value of the resistance $R_2$ can be determined as shown in Equation 23 below.

$$R_2=\frac{F}{C_1\left(w^2-gF^2\right)}-R_1\qquad\text{[Equation 23]}$$

In addition, the last remaining capacitor $C_2$ can be determined as shown in Equation 24 below.

$$C_2=\frac{1}{w^2-gF^2}*\frac{1}{C_1R_2R_1}\qquad\text{[Equation 24]}$$

As described above, a method for determining each circuit parameter of the first SAB integrator 1110_*i* except for the cross-path gain $k_1$ has been described. Except for the cross-path gain $k_1$, the second SAB integrator 1110_*q* may be configured substantially the same as the first SAB integrator 1110_*i*.

Figure 10:
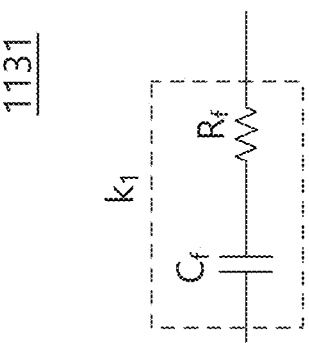
FIG. 10 is a circuit diagram showing an example of implementing the cross path gain by connecting a resistor and a capacitor in series.

FIG. 10 is a circuit diagram showing an example of implementing the cross path gain $k_1$ by connecting a resistor and a capacitor in series. (Alternatively, an inductor (not shown) may be suitably connected to the resistor and the capacitor may be omitted, to implement the cross path gain $k_1$ in an alternative manner.) Referring to FIG. 10, the values of the resistor $R_f$ and capacitor $C_f$ connected in series to implement the cross-path gain '$k_1$' determined according to the frequency shifting value can be derived from Equation 25 below.

[Equation 25]

$$\frac{1}{k_1} = \frac{FR_{in}\left(s + \frac{b}{a}F\right)}{2ws} = \frac{\frac{b}{a}F^2R_{in}\left(\frac{a}{bF}s + 1\right)}{\frac{2w}{s}} = \frac{sC_fR_f + 1}{sC_f}$$

In Equation 25, each of the series-connected resistor $R_f$ and capacitor $C_f$ can be expressed as Equation 26 below.

[Equation 26]

$$R_f = \frac{FR_{in}}{2w},\ C_f = \frac{a}{bFR_f}$$

Lastly, the values of the series-connected resistor $R_f$ and capacitor $C_f$ to implement the cross-path gain $k_1$ can be determined by appropriately selecting the input resistance 'Rin', sampling frequency 'F', and shifting frequency 'w'.

Figure 11:
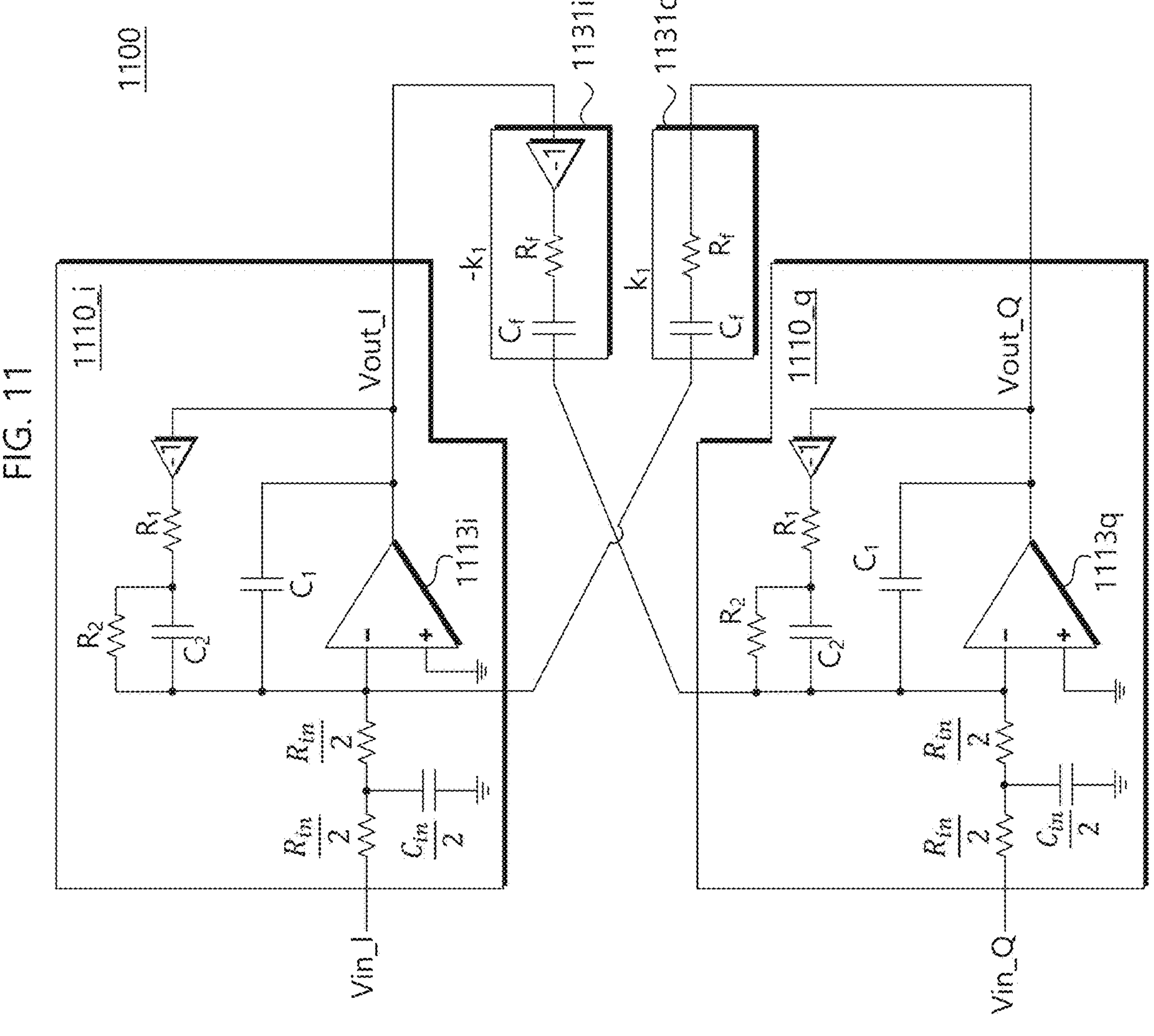
FIG. 11 is a circuit diagram illustrating a loop filter to which the self-path gain and cross-path gain determined in FIGS. 9 and 10 described above are applied.

FIG. 11 is a circuit diagram illustrating a loop filter 1100 to which the self-path gain $k_2$ and cross-path gain $k_1$ determined in FIGS. 9 and 10 described above are applied. Referring to FIG. 11, the loop filter 1100 may include a first SAB integrator 1110_*i* that filters the in-phase input voltage Vin_I and a second SAB integrator 1110_*q* that filters the quadrature input voltage Vin_Q. The loop filter 1100 may further include cross paths 1131*i* and 1131*q* for cross-connecting the outputs of each of the SAB integrators 1110_*i* and 1110_*q* to the input side of the other SAB integrator. (In this discussion, the "input side" of the SAB integrator 1110_*i* or 1110_*q* may be the node at the negative input terminal (−) of the integrating amplifier 1113*i* or 1113*q*, respectively).

The first SAB integrator 1110_*i* generates an in-phase output voltage Vout_I at the first output terminal of the loop filter 1100 (the output node of amplifier 1113*i*) by filtering the in-phase input voltage Vin_I and the feedback quadrature output voltage Vout_Q (the voltage at the second output terminal of the loop filter 1100) in the in-phase path. The input terminal of the first SAB integrator 1110_*i* may use input resistors $R_{in}/2$ connected in series between the in-phase input voltage Vin_I and the negative input terminal (−) of the first amplifier 1113*i* (note that the first and second amplifiers 1113*i* and 1113*q* may each be an OP-AMP). Additionally, an input capacitor $C_{in}/2$ may be connected between the two input resistors $R_{in}/2$ and the ground.

The first SAB integrator 1110_*i* has a SAB structure for configuring a multi-order integrator using one amplifier. In particular, the first SAB integrator 1110_*i* may have the function of a multi-order integrator using one amplifier and a plurality of passive elements. Accordingly, the first SAB integrator 1110_*i* can effectively remove low-frequency components by increasing the slope of the transfer function through implementation of a multi-order integrator. Further, the first SAB integrator 1110_*i* can suppress noise in a specific band of the noise transfer function NTF of the loop filter 1100 through a multi-order integrator.

As previously described for FIG. 7, the first SAB integrator 1110_*i* includes a cross-path gain $k_1$ component and self-path gain $k_2$ component in a feedback path for frequency shifting. To configure the first SAB integrator 1110_*i*, the in-phase input voltage Vin_I provided through the two input resistors Rin/2 and Rin/2 is connected to the negative input terminal (−) of the first amplifier 1113*i*. Additionally, the quadrature output voltage Vout_Q to which the cross-path gain $k_1$ from the second SAB integrator 1110_*q* is applied, is routed to the negative input terminal (−) of the first amplifier 1113*i*. The positive input terminal (+) of the amplifier 1113*i* is grounded. In addition, the in-phase output voltage Vout_I to which the self-path gain $k_2$ is applied is also fed back to the negative input terminal (−) of the first amplifier 1113*i*. The first capacitor $C_1$ is connected between the negative input terminal (−) and the output terminal of the first amplifier 1113*i*. Further, the '−1' gain for the in-phase output voltage Vout_I is fed back to the negative input terminal (−) of the first amplifier 1113*i* via the first resistor $R_1$, the second resistor $R_2$ and the second capacitor $C_2$. Here, to implement the self-path gain '$k_2$', the first SAB integrator 1110_*i* is provided with a second resistor $R_2$ connected in parallel to the second capacitor $C_2$.

It is noted here that when comparing FIGS. 7 and 11, a gain of $k_1$ is applied to the voltage '−Vout_i' in FIG. 7 whereas a gain of $-k_1$ is applied to the voltage Vout_I of FIG. 11, resulting in the same polarity voltage (for both cases of FIGS. 7 and 11) applied to the lower adder of FIG. 7 and the (−) input terminal of the integrator 1113*q* of FIG. 11. Likewise, a gain of $-k_1$ is applied to the voltage '−Vout_q' of FIG. 7 whereas a gain of $k_1$ is applied to the quadrature output voltage Vout_Q of FIG. 11. Note further that the node at the (−) input terminal of the integrator 1113*i* or 1113*q* functions as the corresponding adder of FIG. 7.

The second SAB integrator 1110_*q* generates the quadrature output voltage Vout_Q by filtering the quadrature input voltage Vin_Q and the in-phase output voltage Vout_I fed back in the quadrature path. The input terminal of the second SAB integrator 1110_*q* may be connected to the input resistors $R_{in}/2$ connected in series between the quadrature input voltage Vin_Q and the negative input terminal (−) of the second amplifier 1113*q*. Additionally, an input capacitor $C_{in}/2$ may be connected between the two input resistors $R_{in}/2$ and the ground.

The second SAB integrator 1110_*q* has a SAB structure to configure a multi-order integrator using one amplifier. In particular, the second SAB integrator 1110_*q* may have the function of a multi-order integrator using one amplifier and a plurality of passive elements. Accordingly, the second SAB integrator 1110_*q* can effectively remove low-frequency components by increasing the slope of the transfer function by implementing a multi-order integrator. In particular, the second SAB integrator 1110_*q* can suppress noise in a specific band in the noise transfer function NTF of the loop filter 1100 through a multi-order integrator.

As previously described in FIG. 7, the second SAB integrator 1110_*q* includes the cross-path gain $k_1$ component and self-path gain $k_2$ component for feedback path for frequency shifting. To configure the second SAB integrator 1110_*q*, the quadrature input voltage Vin_Q provided through the input resistors $R_{in}/2$ and $R_{in}/2$ is connected to the negative input terminal (−) of the second amplifier 1113*q*. Additionally, the in-phase output voltage Vout_I to which the cross-path gain $k_1$ from the first SAB integrator 1110_*i* is applied is routed to the negative input terminal (−) of the second amplifier 1113*q*. The positive input terminal (+) of the second amplifier 1113*q* is grounded. In addition, the quadrature output voltage Vout_Q to which the self-path gain $k_2$ is applied is also fed back to the negative input terminal (−) of the second amplifier 1113*q*. The first capacitor $C_1$ is connected between the negative input terminal (−) and the output terminal of the second amplifier 1113*q*. The '−1' gain for the quadrature output voltage Vout_Q is fed back to the negative input terminal (−) of the second amplifier 1113*q* via the first resistor $R_1$, the second resistor $R_2$ and the second capacitor $C_2$. Here, to implement the self-path gain $k_2$, the second SAB integrator 1110_*q* may include a second resistor $R_2$ connected in parallel to the second capacitor $C_2$.

The first cross path 1131*i* multiplies the in-phase output voltage Vout_I by the cross path gain '$-k_1$' and provides it to the negative input terminal (−) of the second amplifier 1113*q*. The first cross path 1131*i* may include a resistor $R_f$ and a capacitor $C_f$ connected in series with each other and with an inverter to implement the cross path gain '−k1'. The values of the series-connected resistor $R_f$ and capacitor $C_f$ can be implemented by appropriately selecting the input resistance $R_{in}$, sampling frequency 'F', and shifting frequency 'w', respectively. In particular, the in-phase output voltage Vout_I is multiplied by '−k1' by the first cross path 1131*i* and (after filtering through the series-connected $R_f$ and capacitor $C_f$) is substantially subtracted from other input signals at the negative input terminal (−) of the second amplifier 1113*q* (a feedback signal through the capacitor $C_1$, and a feedback signal through the other feedback path including the resistor $R_1$, etc. of the SAB integrator 1110_*q*).

The second cross path integrator 1131*q* multiplies the quadrature output voltage Vout_Q by the cross path gain $k_1$ and provides it to the negative input terminal (−) of the first amplifier 1113*i*. The second cross path 1131*q* may include a resistor $R_f$ and a capacitor $C_f$ connected in series to implement the cross path gain $k_1$. The values of the series-connected resistor $R_f$ and capacitor $C_f$ can be implemented by appropriately selecting each of the input resistance $R_{in}$, sampling frequency 'F', and shifting frequency 'w'. The quadrature output voltage Vout_Q is multiplied by 'k1' by the second crossover path 1131*q* and is substantially added to other feedback signals at the negative input terminal (−) of the first amplifier 1113*i* (a feedback signal through the capacitor $C_1$, and a feedback signal through the other feedback path including the resistor $R_1$, etc. of the SAB integrator 1110_*i*).

Through the above-described circuit configuration, flicker noise of low frequency components can be effectively avoided through the application of the cross-coupling technology. In addition, in the above-described structure, the loop filter 1100 can be implemented even when there is no pole of the transfer function or a zero of the noise transfer function NTF (g=0). In addition, the loop filter 1100 can be implemented even when there is no zero of the noise transfer function NTF and there is no frequency shifting (W=0). In addition, when there is no frequency shifting and zero noise transfer function NTF exists, the cross-path gain '$k_1$' may be implemented by combining a resistor and an inductor.

Figure 12:
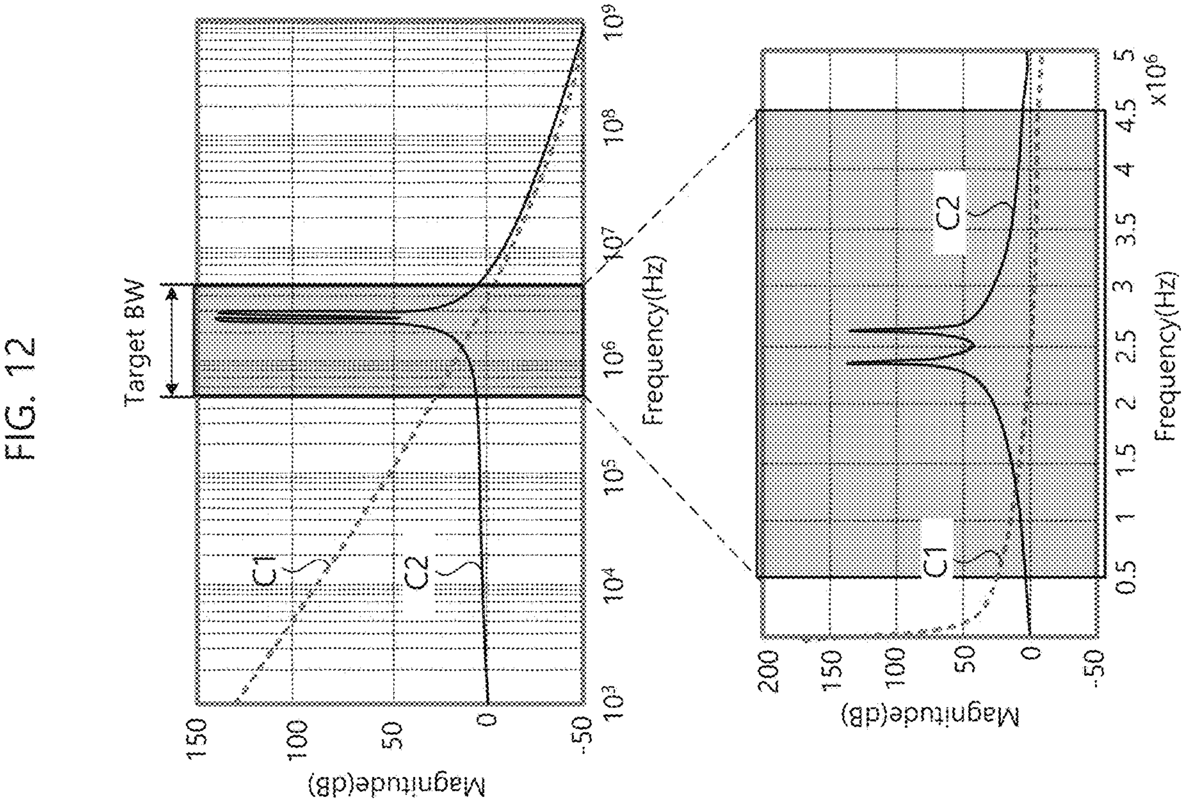
FIG. 12 is a graph briefly showing the transfer function of the loop filter of the present disclosure.

FIG. 12 is a graph showing an example transfer function of the loop filter according to an embodiment. Referring to FIG. 12, the loop filter 1100 (see FIG. 11) of an embodiment applies cross-coupling technology to the SAB integrators 1110_*i* and 1110_*q* to shift the operating band to the target frequency band.

The C1 curve schematically shows the transfer function of the SAB integrator when the cross-coupling of the inventive concept is not applied. The C2 curve shows the transfer function of the loop filter using the cross-coupling technology of the embodiment.

The loop filter 1100 of the embodiment according to the C2 curve allows tuning of the center frequency and peak frequency of the transfer function. As described above, frequency shifting can be applied by setting the cross-path gain '$k_1$' and self-path gain '$k_2$' for tuning the center frequency or peak frequency. Therefore, it is possible to implement the transfer function in a form in which at least one peak is added at a center frequency of a target band, e.g., a center frequency of about 2.5 MHz in the example.

The above are specific embodiments for carrying out the present inventive concept. While the inventive concept has been specifically shown and described with reference to these embodiments, it will be understood that various changes in form and details may be made therein without departing from the spirit and scope of the inventive concept as defined by the following claims and their equivalents.

What is claimed is:

1. A loop filter, comprising:

a first single-amplifier biquad (SAB) integrator configured to apply an integration operation to an in-phase (I) input signal;

a second SAB integrator configured to apply an integration operation to a quadrature (Q) input signal;

a first cross-coupled path between an output terminal of the first SAB integrator and an input side of the second SAB integrator and configured to apply a first gain to an output voltage of the first SAB integrator; and a second cross-coupled path between an output terminal of the second SAB integrator and an input side of the first SAB integrator and configured to apply a negative of the first gain to an output voltage of the second SAB integrator, wherein at least one of the first SAB integrator or the second SAB integrator includes a self-feedback path of a second gain for providing at least one pole to a transfer function of the loop filter, wherein each of the first SAB integrator and the second SAB integrator comprises one operational amplifier, and wherein an output voltage of each one operational amplifier of the first SAB integrator and the second SAB integrator is configured to be fed back to an input of the each one operational amplifier of the first SAB integrator and the second SAB integrator via an inverting circuit, a '−1' gain resistor, and a '−1' gain capacitor, the inverting circuit representing a '−1' operator.

2. The loop filter of claim 1, wherein the first SAB integrator comprises:

a first operational amplifier;

a first input resistor, coupled to a negative input terminal of the first operational amplifier, wherein the I input signal is applied to the first resistor;

a first capacitor connected between an output terminal of the first operational amplifier and the negative input terminal of the first operational amplifier;

a first inverting circuit, a first resistor, and a second capacitor connected in series between the output terminal of the first operational amplifier and the negative input terminal of the first operational amplifier; and a second resistor, connected in parallel with the second capacitor, and connected between the negative input terminal of the first operational amplifier and the first resistor.

3. The loop filter of claim 2, wherein the second SAB integrator comprises:

a second operational amplifier;

a second input resistor, coupled to a negative input terminal of the second operational amplifier, wherein the Q input signal is applied to the second input resistor;

a third capacitor connected between an output terminal of the second operational amplifier and a negative input terminal of the second operational amplifier;

a second inverting circuit, a third resistor, and a fourth capacitor connected in series between the output terminal of the second operational amplifier and the negative input terminal of the second operational amplifier; and a fourth resistor connected in parallel with the fourth capacitor between the negative input terminal of the second operational amplifier and the third resistor.

4. The loop filter of claim 3, wherein a positive input terminal of the first operational amplifier and/or the positive input terminal of the second operational amplifier is grounded.

5. The loop filter of claim 3, wherein the first gain is set to a value corresponding to a magnitude of a shifting frequency in the transfer function.

6. The loop filter of claim 5, wherein at least one of the first cross-coupled path or the second cross-coupled path includes a fifth resistor and a fifth capacitor connected in series to provide the first gain.

7. The loop filter of claim 5, wherein at least one of the first cross-coupled path or the second cross-coupled path includes a fifth resistor and an inductor connected in series to provide the first gain.

8. The loop filter of claim 1, wherein the integration operation of the first and second SAB integrators correspond to a second-order or higher-order integration operation.

9. An analog-to-digital converter (ADC) employing delta-sigma modulation, the ADC comprising:

a loop filter configured to integrate a difference signal between an input signal and a feedback signal;

a quantizer configured to quantize an output of the loop filter to output a digital signal; and a digital-to-analog converter (DAC) configured to convert the digital signal into an analog signal and provide the analog signal as the feedback signal, wherein the difference signal includes an in-phase (I) input signal and a quadrature (Q) input signal, and the loop filter performs single-amplifier biquad (SAB) multi-order integration on each of the I and Q input signals and feeds back each integration result using a respective cross-coupled path, wherein the loop filter comprises:

a first SAB integrator configured to apply an integration operation to the I input signal;

a second SAB integrator configured to apply an integration operation to the Q input signal;

a first cross-coupled path configured to provide an output of the first SAB integrator to an input terminal of the second SAB integrator with a first gain; and a second cross-coupled path configured to provide an output of the second SAB integrator to an input terminal of the first SAB integrator with a negative of the first gain, wherein each of the first SAB integrator and the second SAB integrator comprises one operational amplifier, and wherein an output voltage of each one operational amplifier of the first SAB integrator and the second SAB integrator is configured to be fed back to an input of the each one operational amplifier of the first SAB integrator and the second SAB integrator via an inverting circuit, a '−1' gain resistor, and a '−1' gain capacitor, the inverting circuit representing a '−1' operator.

10. The ADC of claim 9, wherein at least one of the first SAB integrator or the second SAB integrator includes a self-feedback path for providing at least one pole to a transfer function of the loop filter.

11. The ADC of claim 10, wherein the first SAB integrator comprises:

a first operational amplifier;

a first input resistor configured to transmit the I input signal to a negative input terminal of the first operational amplifier;

a first capacitor connected between an output terminal of the first operational amplifier and a negative input terminal of the first operational amplifier;

a first inverting circuit, a first resistor, and a second capacitor connected in series between the output terminal of the first operational amplifier and the negative input terminal of the first operational amplifier; and a second resistor connected in parallel with the second capacitor between the negative input terminal of the first operational amplifier and the first resistor.

12. The ADC of claim 11, wherein the second SAB integrator comprises:

a second operational amplifier;

a second input resistor configured to transmit the Q input signal to a negative input terminal of the second operational amplifier;

a third capacitor connected between an output terminal of the second operational amplifier and a negative input terminal of the second operational amplifier;

a second inverting circuit, a third resistor, and a fourth capacitor connected in series between the output terminal of the second operational amplifier and the negative input terminal of the second operational amplifier; and a fourth resistor connected in parallel with the fourth capacitor between the negative input terminal of the second operational amplifier and the third resistor.

13. The ADC of claim 12, wherein the first gain corresponds to a value that determines a magnitude of a shifting frequency in the transfer function.

14. The ADC of claim 13, wherein at least one of a positive input terminal of the first operational amplifier or a positive input terminal of the second operational amplifier is grounded.

15. The ADC of claim 14, wherein at least one of the first cross-coupled path or the second cross-coupled path includes a fifth resistor and a fifth capacitor connected in series to provide the first gain.

16. The ADC of claim 15, wherein the first cross-coupled path or the second cross-coupled path includes a fifth resistor and an inductor connected in series to provide the first gain.

17. A loop filter, comprising:

a first integrator configured to apply an integration operation to an in-phase (I) input signal;

a second integrator configured to apply an integration operation to a quadrature (Q) input signal; and a cross-coupled path configured to cross-transfer an output voltage of the first integrator to an input side of the second integrator, and an output voltage of the second integrator to an input side of the first integrator, wherein at least one of the first integrator or the second integrator performs the respective integration operation using a single-amplifier biquad (SAB) integrator configuration, wherein the SAB integrator configuration includes an SAB integrator comprises one operational amplifier, and wherein an output voltage of the one operational amplifier is configured to be fed back to an input of the one operational amplifier via an inverting circuit, a '−1' gain resistor, and a '−1' gain capacitor, the inverting circuit representing a '−1' operator.

18. The loop filter of claim 17, wherein the cross-coupled path comprises:

a first cross-coupled path configured to transfer the output of the first integrator with a first gain to the input side of the second integrator; and a second cross-coupled path configured to transfer the output of the second integrator with a negative of the first gain to the input side of the first integrator.

19. The loop filter of claim 18, wherein at least one of the first cross-coupled path or the second cross-coupled path includes a resistor and a capacitor connected in series to provide the first gain.

* * * * *